United States Patent
Chien et al.

[11] Patent Number: 5,904,154
[45] Date of Patent: May 18, 1999

[54] METHOD FOR REMOVING FLUORINATED PHOTORESIST LAYERS FROM SEMICONDUCTOR SUBSTRATES

[75] Inventors: Rong-Wu Chien; Hsiu-Lan Lee; Tzu-Shih Yen, all of Hsinchu, Taiwan

[73] Assignee: Vanguard International Semiconductor Corporation, Hsin-Chu, Taiwan

[21] Appl. No.: 08/899,669

[22] Filed: Jul. 24, 1997

[51] Int. Cl.$^6$ .............................. H01L 21/302; B08B 6/00
[52] U.S. Cl. ........................... 134/1.2; 438/750; 438/734; 438/725; 438/723
[58] Field of Search .............................. 134/1.2; 438/725, 438/723, 724, 734, 743, 744, 750

[56] References Cited

U.S. PATENT DOCUMENTS

| | | | |
|---|---|---|---|
| 4,437,961 | 3/1984 | Routh et al. | 204/192 EC |
| 5,200,360 | 4/1993 | Bradbury et al. | 437/192 |
| 5,443,941 | 8/1995 | Bariya et al. | 430/313 |
| 5,681,780 | 10/1997 | Mihara et al. | 437/228 |
| 5,702,869 | 12/1997 | Chien et al. | 430/313 |
| 5,714,037 | 2/1998 | Puntambekan et al. | 156/643.1 |

FOREIGN PATENT DOCUMENTS

5-036839  2/1993  Japan .

*Primary Examiner*—Benjamin Utech
*Assistant Examiner*—George Goudreau
*Attorney, Agent, or Firm*—George O. Saile; Stephen B. Ackerman; Alek P. Szecsy

[57] ABSTRACT

A method for removing from a patterned silicon containing dielectric layer a patterned partially fluorinated photoresist layer employed in patterning the patterned silicon containing dielectric layer. There is first formed over a semiconductor substrate a metal contact layer having a silicon containing dielectric layer formed thereover. There is then formed upon the silicon containing dielectric layer a patterned photoresist layer. There is then formed by use of a reactive ion etch (RIE) plasma etch method employing a fluorine containing etchant a via through the silicon containing dielectric layer to form a patterned silicon containing dielectric layer reaching the metal contact layer. The reactive ion etch (RIE) plasma etch method simultaneously forms from the patterned photoresist layer a partially fluorinated patterned photoresist layer comprising a patterned fluorinated surface layer of the partially fluorinated patterned photoresist layer and a patterned non-fluorinated underlying remainder layer of the partially fluorinated patterned photoresist layer. The reactive ion etch (RIE) plasma etch method also simultaneously forms upon the sidewalls of the via a metal-polymer residue layer. There is then removed, at least partially, the patterned fluorinated surface layer of the partially fluorinated patterned photoresist layer through a first stripping method employing an argon containing plasma under conditions such that the metal-polymer residue layer is not substantially oxidized. Finally, there is then removed through a second stripping method at least the metal-polymer residue layer from the sidewalls of the via.

18 Claims, 8 Drawing Sheets

METHOD FOR REMOVING FLUORINATED PHOTORESIST LAYERS FROM SEMICONDUCTOR SUBSTRATES

BACKGROUND OF THE INVENTION

1. Field of the Invention

The present invention relates generally to photoresist layers employed in integrated circuit fabrication. More particularly, the present invention relates to methods for removing from semiconductor substrates photoresist layers which have become fluorinated in the process of integrated circuit fabrication.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

In the process of connecting and interconnecting electrical circuit elements with patterned conductor layers which are separated by dielectric layers within integrated circuits, it is common in the art of integrated circuit fabrication to form vias and other apertures through those dielectric layers such that conductive connections may be made between the patterned conductor layers and the electrical circuit elements which are separated by the dielectric layers. Although vias and other apertures within and/or through dielectric layers within integrated circuits may be formed through photolithographic methods followed by etch methods including but not limited to wet chemical etch methods and reactive ion etch (RIE) dry plasma etch methods, it has become quite common in the art that vias and other apertures formed within and/or through dielectric layers within integrated circuits will typically be formed through reactive ion etch (RIE) dry plasma etch methods. Since dielectric layers within integrated circuits are typically formed from silicon containing dielectric materials such as but not limited to silicon oxide dielectric materials, silicon nitride dielectric materials and silicon oxynitride dielectric materials, it is consequently also common in the art of integrated circuit fabrication that reactive ion etch (RIE) dry plasma etch methods which are employed in forming vias and other apertures within and/or through dielectric layers formed of those silicon containing dielectric materials will typically employ fluorine containing reactive ion etch (RIE) plasma etchants. Fluorine containing reactive ion etch (RE) plasma etchants are preferably employed since upon reaction with dielectric layers formed of silicon containing dielectric materials they form volatile species which are readily exhausted from reactive ion etch (RIE) plasma etch chambers.

While vias and other apertures within and/or through silicon containing dielectric layers may typically be effectively etched by means of fluorine containing reactive ion etch (RIE) plasma etch methods, fluorine containing reactive ion etch (RIE) plasma etch methods are not without problems in etching within integrated circuits dielectric layers formed of silicon containing materials. In particular, fluorine containing reactive ion etch (RIE) plasma etch methods are known in the art of integrated circuit fabrication to partially fluorinate patterned photoresist layers which are employed as etch masks through which vias and/or apertures within and/or through silicon containing dielectric layers within integrated circuits are patterned. The partially fluorinated patterned photoresist layers formed through fluorine containing reactive ion etch (RIE) plasma etch methods typically have a fluorinated surface layer of the partially fluorinated patterned photoresist layer and a non-fluorinated underlying remainder layer of the partially fluorinated patterned photoresist layer.

The fluorinated surface layers of partially fluorinated patterned photoresist layers are often difficult to effectively remove through either high power oxygen dry plasma photoresist stripping methods or wet chemical photoresist stripping methods as are known in the art. For example, when fluorinated surface layers of partially fluorinated patterned photoresist layers are removed through high power oxygen dry plasma photoresist stripping methods, damage often occurs to exposed layers adjoining the fluorinated surface layers. In contrast, under circumstances where a fluorinated surface layer of a partially fluorinated patterned photoresist layer is dislodged by dissolving in a wet chemical photoresist stripping solution a non-fluorinated underlying remainder layer of the partially fluorinated patterned photoresist layer, the fluorinated surface layer of the partially fluorinated patterned photoresist layer often redistributes upon the surface of the integrated circuit from which it was dislodged, thus obscuring the features of the integrated circuit from further processing. By obscuring features of the integrated circuit from further processing, it often becomes difficult to form fully functional or reliable integrated circuits Moreover, when a substantial concentration of portions of fluorinated surface layers of partially fluorinated patterned photoresist layers remains in a wet chemical photoresist stripping solution, the active lifetime of the wet chemical photoresist stripping solution is decreased. Finally, the lifetime of a recirculating filter employed in purifying the wet chemical photoresist stripping solution having contained therein the substantial concentration of fluorinated surface portions of partially fluorinated patterned photoresist layers is also decreased.

Beyond the foregoing problems generally encountered when removing fluorinated surface layers of partially fluorinated patterned photoresist layers formed incident to patterning through fluorine containing reactive ion etch (RIE) methods silicon containing dielectric layers within integrated circuits, additional problems are often encountered when the fluorinated surface layers of the partially fluorinated patterned photoresist layers are formed incident to patterning through fluorine containing reactive ion etch (RIE) methods silicon containing dielectric layers to form vias accessing metal contact layers within integrated circuits. Under such circumstances, there is typically formed, in addition to the fluorinated surface layer of the partially fluorinated patterned photoresist layer, a metal-polymer residue layer upon the sidewalls of both: (1) the via formed through the silicon containing dielectric layer; and (2) the partially fluorinated patterned photoresist layer employed in defining the via formed through the silicon containing dielectric layer. A schematic cross-sectional diagram illustrating such an integrated circuit structure is shown in FIG. 10.

Figure 10:
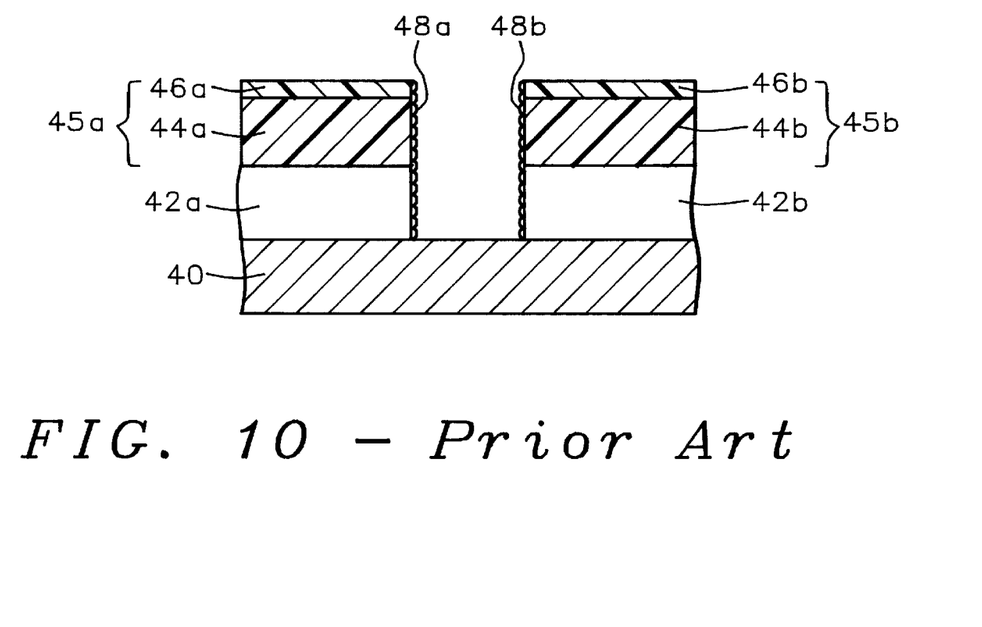
FIG. 10 and FIG. 11 show a pair of schematic cross-sectional diagrams illustrating corrosion of a metal contact layer incident to removing from a patterned silicon containing dielectric layer which defines a via accessing the metal contact layer a partially fluorinated patterned photoresist layer through a method conventional in the art of integrated circuit fabrication.

Shown in FIG. 10 is a metal contact layer 40 having formed thereupon a pair of patterned silicon containing dielectric layers 42a and 42b. The pair of patterned silicon containing dielectric layers 42a and 42b is formed through patterning a blanket silicon containing dielectric layer through a fluorine containing reactive ion etch (RIE) plasma etch method while employing a patterned photoresist layer as an etch mask layer. Through exposure to the fluorine containing reactive ion etch (RIE) plasma etch method, there is formed from the patterned photoresist layer a pair of partially fluorinated patterned photoresist layers 45a and 45b comprising: (1) a pair of fluorinated surface layers 46a and 46b of the pair of partially fluorinated patterned photoresist layers 45a and 45b; and (2) a pair of non-fluorinated underlying remainder layers 44a and 44b of the pair of partially fluorinated patterned photoresist layers 45a and 45b. Finally, there is shown in FIG. 10 the presence of a pair metal-polymer residue layers 48a and 48b formed upon the sidewalls of: (1) the patterned silicon containing dielectric layers 42a and 42b; and (2) the partially fluorinated patterned photoresist layers 45a and 45b.

When it is attempted to remove the fluorinated surface layers 46a and 46b of the partially fluorinated patterned photoresist layers 45a and 45b through a high power oxygen plasma etch method as is conventional in the art of integrated circuit fabrication, the metal-polymer residue layers 48a and 48b are often sufficiently oxidized such that they are not readily subsequently removed through wet chemical stripping methods through which they would otherwise subsequently conventionally be removed. Alternatively, when it is attempted to remove the fluorinated surface layers 46a and 46b of the partially fluorinated patterned photoresist layers 45a and 45b through dissolution within a wet chemical stripping solution of the non-fluorinated underlaying remainder layers 44a and 44b of the partially fluorinated patterned photoresist layers 45a and 45b, there is often encountered an integrated circuit structure analogous to the integrated circuit structure whose schematic cross-sectional diagram is illustrated in FIG. 11.

Figure 11:
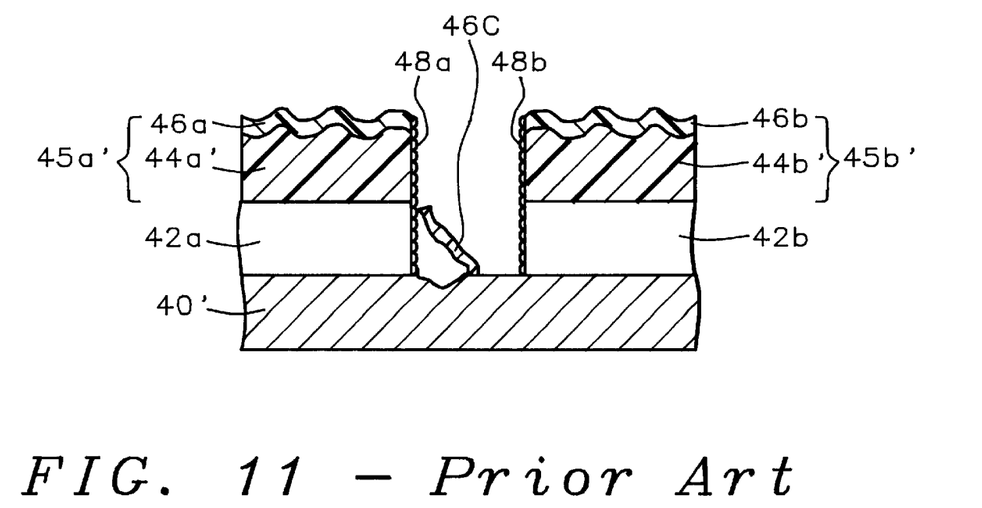

Shown in FIG. 11 is the presence of a pair of partially dissolved non-fluorinated underlying remainder layers 44a' and 44b' within a pair of partially dissolved partially fluorinated patterned photoresist layers 45a' and 45b', where the pair of partially dissolved non-fluorinated underlying remainder layers 44a' and 44b' has the pair of fluorinated surface layers 46a and 46b remaining thereupon. Also shown in FIG. 11 is a dislodged and redistributed fluorinated surface layer 46c which has dislodged within the wet chemical photoresist stripping solution and redistributed upon the surface of the metal contact layer 40, thus occluding a portion of the surface of the metal contact layer 40 and assisting in forming a corroded metal contact layer 40'. Thus, it is in part towards the goal of avoiding the formation within integrated circuits of corroded metal contact layers, such as the corroded metal contact layer 40', that the present invention is in part directed.

In a more general sense, it is also an object of the present invention to provide a method for removing from a patterned silicon containing dielectric layer within an integrated circuit a partially fluorinated patterned photoresist layer in a fashion such that: (1) layers surrounding the partially fluorinated patterned photoresist layer are not damaged; (2) the partially fluorinated patterned photoresist layer does not leave a residue which impedes formation of a fully functional or reliable integrated circuit; or (3) a metal-polymer residue layer which typically forms upon the sidewall of a via formed through the patterned silicon containing dielectric layer to a metal contact layer while employing the partially fluorinated patterned photoresist layer as an etch mask is not sufficiently oxidized to make the metal-polymer residue layer difficult to remove from the integrated circuit.

Methods through which anti-reflection coating (ARC) halocarbon plasma polymers, such as fluorocarbon plasma polymers, may be formed upon and removed from integrated circuits have been disclosed in the art of integrated circuit fabrication. For, example, Bariya, in U.S. Pat. No. 5,443,941 discloses a method for removing from a semiconductor substrate a fluorocarbon plasma polymer through an oxygen plasma etching and ashing method.

More pertinent to the present invention, however, is a related co-assigned and partially co-invented application, serial number 08/660,302, filed Jun. 7, 1996, now U.S. Pat. No. 5,702,867 entitled "Soft Ashing Method for Removing Fluorinated Photoresist Layers From Semiconductor Substrates." While the method disclosed and claimed within the related co-assigned and partially co-invented application provides advantages with respect to removing fluorinated surface layers of partially fluorinated patterned photoresist layers within integrated circuits, the method as disclosed and claimed within the related co-assigned and partially co-invented application suffers from some deficiencies in optimally removing fluorinated surface layers of partially fluorinated patterned photoresist layers from upon patterned silicon containing dielectric layers having vias formed therethrough accessing metal contact layers, while limiting oxidation of metal-polymer residues formed upon the via sidewalls. It is thus towards providing a more optimal method for removing fluorinated surface layers of partially fluorinated patterned photoresist layers formed within integrated circuits within which there are also formed metal-polymer residue layers that the present invention is more specifically directed.

Thus, desirable in the art are additional methods through which partially fluorinated photoresist layers may be removed from integrated circuits. Similarly, particularly desirable are methods through which may be sequentially removed a fluorinated surface layer of a patterned partially fluorinated photoresist layer and a non-fluorinated underlying remainder layer of the patterned partially fluorinated photoresist layer from upon a patterned silicon containing dielectric layer having a via formed therethrough accessing a metal contact layer within an integrated circuit, without: (1) damaging integrated circuit layers adjoining the patterned partially fluorinated photoresist layer; (2) forming a residue which impedes the production of a fully functional and reliable integrated circuit; or (3) oxidizing a metal-polymer residue which typically forms upon the sidewall of the via formed through the silicon containing dielectric layer to the metal contact layer beneath the silicon containing dielectric layer.

SUMMARY OF THE INVENTION

A first object of the present invention is to provide a method for removing from an integrated circuit a partially fluorinated photoresist layer.

A second object of the present invention is to provide a method in accord with the first object of the present invention, which method also does not damage integrated circuit layers adjoining the partially fluorinated photoresist layer.

A third object of the present invention is to provide a method in accord with the first object of the present invention, which method also leaves no residue which impedes formation of a fully functional or reliable integrated circuit, such as a dislodged fluorinated surface layer of a partially fluorinated photoresist layer which redeposits upon a metal contact layer and facilitates corrosion of the metal contact layer.

A fourth object of the present invention is to provide a method in accord with the first object of the present invention, which method also does not oxidize a metal-polymer residue which typically forms upon sidewalls of a via formed through a silicon containing dielectric layer to a metal contact layer while employing a patterned partially fluorinated photoresist layer as an etch mask.

A fifth object of the present invention is to provide a method in accord with the first object of the present invention, the second object of the present invention, the third object of the present invention or the fourth object of the present invention, which method is also readily manufacturable.

In accord with the objects of the present invention, there is provided by the present invention a method for removing from a patterned silicon containing dielectric layer within an integrated circuit a patterned partially fluorinated photoresist layer employed in patterning the patterned silicon containing dielectric layer. To practice the method of the present invention, there is first formed over a semiconductor substrate a metal contact layer. There is then formed upon the metal contact layer a silicon containing dielectric layer. There is then formed upon the silicon containing dielectric layer a patterned photoresist layer. There is then formed, while employing the patterned photoresist layer as an etch mask and by use of a reactive ion etch (RIE) plasma etch method employing a fluorine containing plasma etchant, a via through the silicon containing dielectric layer to form a patterned silicon containing dielectric layer. The via reaches the metal contact layer. The reactive ion etch (RIE) plasma etch method simultaneously forms from the patterned photoresist layer a partially fluorinated patterned photoresist layer comprising a patterned fluorinated surface layer of the partially fluorinated patterned photoresist layer and a patterned non-fluorinated underlying remainder layer of the partially fluorinated patterned photoresist layer. The reactive ion etch (RIE) plasma etch method also simultaneously forms upon the sidewalls of the via a metal-polymer residue layer. There is then removed, at least partially, the patterned fluorinated surface layer of the partially fluorinated patterned photoresist layer through a first stripping method. The first stripping method employs an argon containing plasma under conditions such that the metal-polymer residue layer is not substantially oxidized. Finally, there is then removed through a second stripping method at least the metal-polymer residue layer from the via sidewalls.

Through the method of the present invention there may be removed from integrated circuits partially fluorinated photoresist layers while: (1) not damaging integrated circuit layers adjoining the partially fluorinated photoresist layers; (2) not leaving remaining residues which impede formation of fully functional or reliable integrated circuits, such as dislodged fluorinated surface layers of partially fluorinated photoresist layer which redeposit upon metal contact layers and facilitate corrosion of those metal contact layers; or (3) not oxidizing a metal-polymer residue which typically forms upon a via sidewall when forming a via through a silicon containing dielectric layer to a metal contact layer while employing a patterned partially fluorinated photoresist layers as an etch mask. Through employing within the method of the present invention the first stripping method which employs the argon containing plasma under conditions such that a metal-polymer residue layer is not substantially oxidized, there may be removed from integrated circuits partially fluorinated photoresist layers in accord with the foregoing constraints.

The method of the present invention is readily manufacturable. The method of the present invention employs, in removing a fluorinated surface layer of a partially fluorinated photoresist layer, an argon containing plasma employed under conditions where a metal-polymer residue layer is not substantially oxidized. The use of plasmas, including argon plasmas, under conditions which provide for removal of fluorinated surface layers of partially fluorinated photoresist layers while not oxidizing metal-polymer residue layers provide readily manufacturable methods.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for removing from a patterned silicon containing dielectric layer having formed therethrough a via which accesses a metal contact layer formed beneath the patterned silicon containing dielectric layer a patterned partially fluorinated photoresist layer employed in patterning the patterned silicon containing dielectric layer, while, among other features, not oxidizing a metal-polymer residue layer formed upon the via sidewall. The method of the present invention achieves this goal by stripping, at least partially, a fluorinated surface layer of the patterned partially fluorinated photoresist layer while employing an argon containing plasma under conditions where the metal-polymer residue layer is not substantially oxidized. There is then removed through a subsequent second stripping method at least the metal-polymer residue layer from the via sidewall.

Typically, although not exclusively, the patterned partially fluorinated photoresist layer is fluorinated through a reactive ion etch (RIE) plasma etch method employing a fluorine containing plasma etchant. The reactive ion etch (RIE) plasma etch method employing the fluorine containing plasma etchant is typically employed in patterning a blanket silicon containing dielectric layer, such as a blanket silicon oxide dielectric layer, which is formed beneath the patterned partially fluorinated photoresist layer. The method of the present invention may, however, also be employed in removing from semiconductor substrates, or other integrated circuit layers, partially fluorinated photoresist layers which have deliberately or incidentally become partially fluorinated through: (1) exposure to fluorine containing reactive ion etch (RIE) plasma etchants; or (2) other equivalent fluorinating methods, while not oxidizing metal layers or metal-polymer layers in the presence of those partially fluorinated photoresist layers.

The method of the present invention may be employed in removing partially fluorinated photoresist layers from the surfaces of silicon containing dielectric layers formed within various locations within integrated circuits. The method of the present invention may be employed in removing partially fluorinated photoresist layers from silicon containing dielectric layers formed within locations within integrated circuits including but not limited to the first silicon containing dielectric layer location within an integrated circuit which contacts a semiconductor substrate within the integrated circuit, as well as upper lying silicon containing dielectric layer locations which separate upper lying conductor layers within the integrated circuit.

The method of the present invention may be employed in removing partially fluorinated photoresist layers from silicon containing dielectric layers within integrated circuits including but not limited to dynamic random access memory (DRAM) integrated circuits, static random access memory (SRAM) integrated circuits, application specific integrated circuits (ASICs), integrated circuits having within their fabrications field effect transistors (FETs), integrated circuits having within their fabrications bipolar transistors and integrated circuits having within their fabrications bipolar complementary metal oxide semiconductor (BiCMOS) transistors. The method of the present invention has broad applicability in removing from silicon containing dielectric layers within various types of integrated circuits partially fluorinated photoresist layers.

Figure 1:
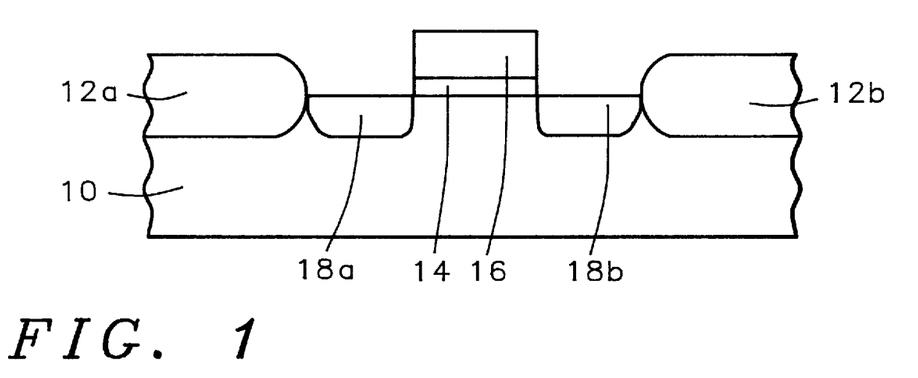
FIG. 1 to FIG. 9 show a series of schematic cross-sectional diagrams illustrating the results of progressive stages in forming an integrated circuit having formed therein multiple patterned silicon containing dielectric layers which are patterned employing partially fluorinated patterned photoresist layers which are removed from the integrated circuit through the method of the present invention.

Referring now to FIG. 1 to FIG. 9, there is shown a series of schematic cross-sectional diagrams illustrating the results of progressive stages in forming within an integrated circuit multiple patterned silicon containing dielectric layers from whose surfaces are removed partially fluorinated patterned photoresist layers through the preferred embodiment of the method of the present invention. Shown in FIG. 1 is a schematic cross-sectional diagram of the integrated circuit at an early stage in its fabrication.

Shown in FIG. 1 is a semiconductor substrate 10 having formed within and upon its surface a pair of isolation regions 12a and 12b which defines an active region of the semiconductor substrate 10. In addition, formed within and upon the active region of the semiconductor substrate 10 is a field effect transistor (FET) which comprises: (1) a gate dielectric layer 14 formed upon the active region of the semiconductor substrate 10; (2) a gate electrode 16 formed and aligned upon the gate dielectric layer 14; and (3) a pair of source/drain regions 18a and 18b formed into the active region of the semiconductor substrate 10 at areas not occupied by the gate dielectric layer 14 and the gate electrode 16. The semiconductor substrate 10 and the isolation regions 12a and 12b, as well as each of elements which comprises the field effect transistor (FET) formed within the active region of the semiconductor substrate 10, as illustrated in FIG. 1, may be formed through methods as are conventional in the art of integrated circuit fabrication.

For example, although semiconductor substrates are know in the art of integrated circuit fabrication to have either dopant polarity, various dopant concentrations and various crystallographic orientations, the semiconductor substrate 10 employed within the preferred embodiment of the method of the present invention is preferably a (100) silicon semiconductor substrate having an N- or P- doping. In addition, while it is also known in the art that isolation regions may be formed within and/or upon semiconductor substrates through methods including but not limited to isolation region thermal growth methods and isolation region deposition/pattering methods, for the preferred embodiment of the method of the present invention the isolation regions 12a and 12b are preferably formed within and upon the semiconductor substrate 10 through an isolation region thermal growth method a temperature of from about 900 to about 1200 degrees centigrade to form isolation regions 12a and 12b of silicon oxide within and upon the semiconductor substrate 10.

Finally, with respect to the elements which comprise the field effect transistor (FET) formed within and upon the active region of the semiconductor substrate 10, it is known in the art that: (1) gate dielectric layers may be formed through patterning, through methods as are conventional in the art of blanket gate dielectric layers formed through methods including but not limited to blanket gate dielectric layer thermal growth methods and blanket gate dielectric layer deposition/patterning methods; (2) gate electrodes are typically formed upon gate dielectric layers through patterning, through methods as are conventional in the art, of blanket layers of gate electrode materials formed of conductive materials including but not limited to metals, metal alloys and highly doped polysilicon; and (3) source/drain regions are typically formed within active regions of semiconductor substrates through ion implantation methods employing dopant ions of polarity suitable to the polarity of the field effect transistor (FET) desired to be formed.

Thus, for the preferred embodiment of the method of the present invention, the gate dielectric layer 14 is preferably formed through patterning, through methods as are conventional in the art, of a blanket gate dielectric layer formed through thermal oxidation of the active region of the semiconductor substrate 10 at a temperature of about 900 to about 1200 degrees centigrade. Similarly, the gate electrode 16 is preferably formed through patterning, through methods as are conventional in the art, of a highly doped polysilicon layer formed upon the blanket gate dielectric layer through a chemical vapor deposition (CVD) method employing silane as a silicon source material, along with suitable dopants. Finally, the source/drain electrode regions 18a and 18b are preferably formed through implanting a suitable dopant into the active region of the semiconductor substrate 10 at an ion implantation dose of from about 1E15 to about =E16 ions per square centimeter and an ion implantation energy of from about 30 to about 40 keV.

Figure 2:
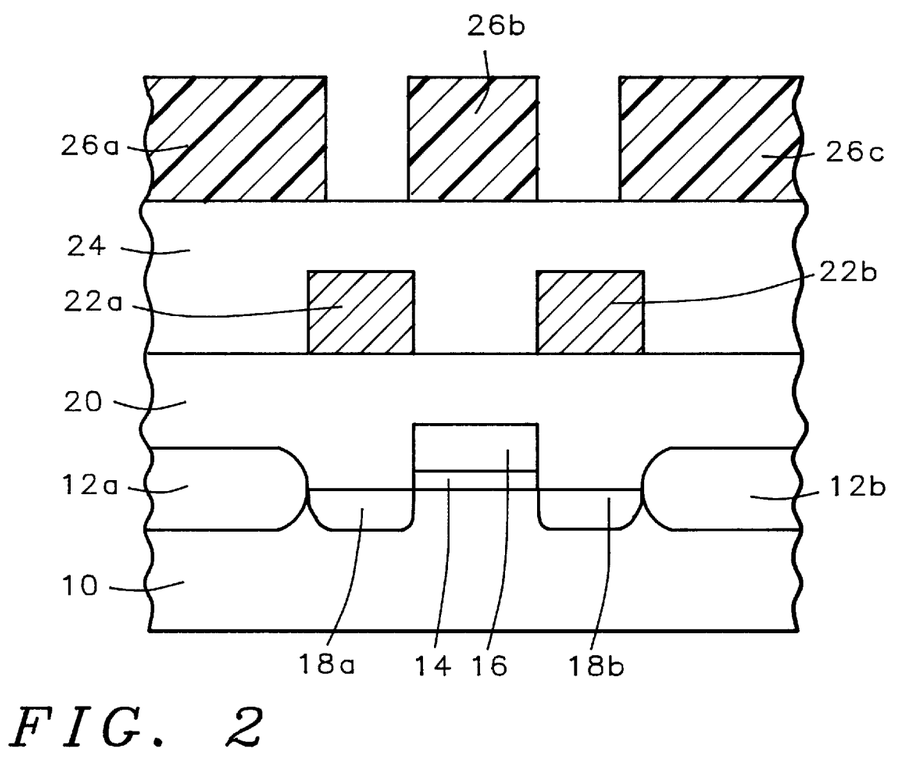

Referring now to FIG. 2, there is shown a schematic cross-sectional diagram illustrating the results of further processing of the integrated circuit whose schematic cross-sectional diagram is illustrated in FIG. 1. Shown in FIG. 2 is a planarized pre-metal dielectric (PMD) layer 20 formed upon the integrated circuit whose schematic cross-sectional diagram is illustrated in FIG. 1, including the elements which comprise the field effect transistor (FET). Planarized pre-metal dielectric (PMD) layers are known in the art of integrated circuit fabrication. Planarized pre-metal dielectric (PMD) layers are typically formed within integrated circuits through planarizing, through methods as are conventional in the art, of conformal pre-metal dielectric (PMD) layers which are commonly formed within integrated circuits from dielectric materials including but not limited to silicon oxide dielectric materials, silicon nitride dielectric materials and silicon oxynitride materials. Conformal pre-metal dielectric (PMD) layers may be formed through methods including but not limited to chemical vapor deposition (CVD) methods, plasma enhanced chemical vapor deposition (PECVD) methods and physical vapor deposition (PVD) sputtering methods, and planarized through methods as are conventional in the art, including but not limited to reactive ion etch (RIE) etch-back planarizing methods and chemical mechanical polish (CMP) planarizing methods. For the preferred embodiment of the method of the present invention, the planarized pre-metal dielectric (PMD) layer 20 is preferably: (1) formed from a silicon oxide dielectric material deposited conformally upon the semiconductor substrate 10 through a plasma enhanced chemical vapor deposition (PECVD) method; and (2) planarized through a chemical mechanical polish (CMP) planarizing method, as is common in the art. Preferably, the planarized pre-metal dielectric (PMD) layer 20 is from about 5000 to about 15000 angstroms thick.

As is also illustrated in FIG. 2, there is formed upon the planarized pre-metal dielectric (PMD) layer 20 a pair of patterned first conductor layers 22a and 22b. The patterned first conductor layers 22a and 22b are preferably formed through patterning, through methods as are conventional in the art, of a blanket first conductor layer. As is known in the art, blanket conductor layers within integrated circuits may be formed through methods including but not limited to thermal evaporation methods, physical vapor deposition (PVD) sputtering methods and chemical vapor deposition (CVD) methods through which may be formed blanket conductor layers of conductor materials including but not limited to metals, metal alloys and polysilicon. For the preferred embodiment of the method of the present invention, the patterned first conductor layers 22a and 22b are preferably formed through patterning, through methods as are conventional in the art, of a blanket first conductor layer formed at least in part of aluminum or an aluminum alloy, as is common in the art. Preferably, the patterned first conductor layers 22a and 22b are from about 3000 to about 10000 angstroms thick each.

As is also illustrated in FIG. 2, there is formed upon the exposed portions of the planarized pre-metal dielectric (PMD) layer 20 and the patterned first conductor layers 22a and 22b, a planarized first inter-metal dielectric (IMD) layer 24. The planarized first inter-metal dielectric (IMD) layer 24 is preferably formed through methods and materials analogous to the methods and materials employed in forming the planarized pre-metal dielectric (PMD) layer 20. Preferably, the planarized first inter-metal dielectric (IMD) layer 24 is from about 6000 to about 12000 angstroms thick.

Finally, there is also shown in FIG. 2 the presence of patterned first photoresist layers 26a, 26b and 26c formed upon the surface of the planarized first inter-metal dielectric (IMD) layer 24. The patterned first photoresist layers 26a, 26b and 26c are formed through patterning, through methods as are conventional in the art, of a blanket first photoresist layer. Several photoresist materials from which may be formed blanket photoresist layers are known in the art of integrated circuit manufacture. Such photoresist materials include but are not limited to novolak photoresist materials and poly-methyl-meth-acrylate (PMMA) photoresist materials. While either of the foregoing photoresist materials, or many other photoresist materials, may be employed in forming the patterned first photoresist layers 26a, 26b and 26c within the preferred embodiment of the method of the present invention, the preferred embodiment of the method of the present invention provides value in removing a fluorinated surface layer of a partially fluorinated patterned photoresist layer when the patterned photoresist layers are formed from a photoresist material which is susceptible to fluorination in a reactive ion etch (RIE) plasma formed from a fluorine containing plasma etchant. Thus, for the preferred embodiment of the method of the present invention, the patterned first photoresist layers 26a, 26b and 26c are preferably formed of a photoresist material which is susceptible to fluorination in a reactive ion etch (RIE) plasma formed from a fluorine containing plasma etchant which is employed in patterning the planarized first inter-metal dielectric (IMD) layer 24 while employing the patterned first photoresist layers 26a, 26b and 26c as a mask. Preferably, the patterned first photoresist layers 26a, 26b and 26c are from about 2000 to about 14000 angstroms thick each, and the apertures between the corresponding patterned first photoresist layers 26a and 26b and the corresponding patterned first photoresist layers 26b and 26c are typically from about 4000 to about 10000 angstroms in width, thus exposing the surface of the planarized first inter-metal dielectric (IMD) layer 24.

Figure 3:
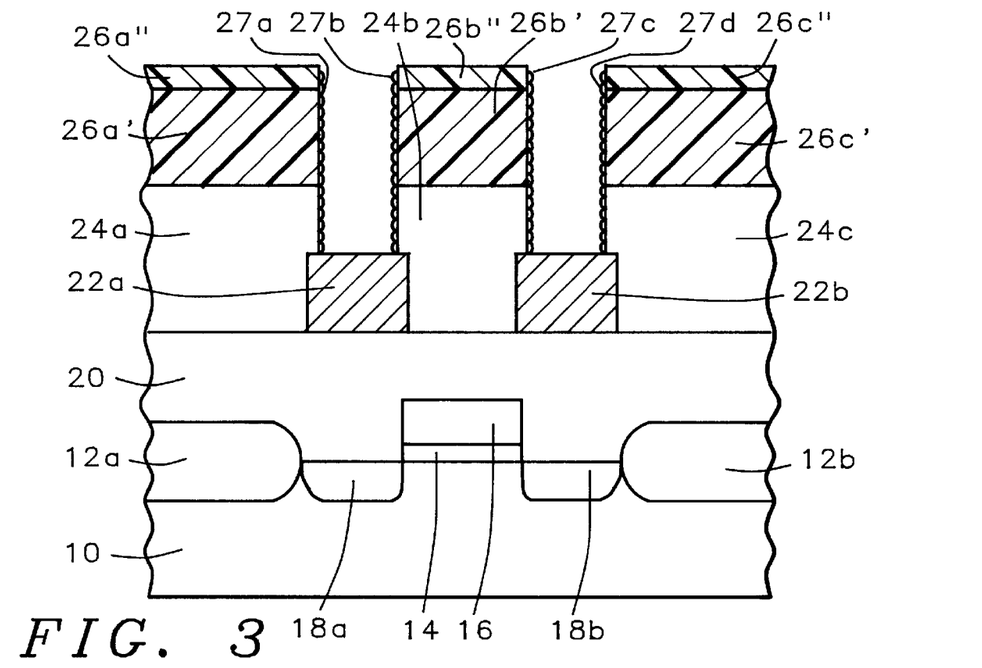

Referring now to FIG. 3, there is shown a schematic cross-sectional diagram illustrating the results of further processing of the integrated circuit whose schematic cross-sectional diagram is illustrated in FIG. 2. Shown in FIG. 3 is the presence of the patterned planarized first inter-metal dielectric (IMD) layers 24a, 24b and 24c which are formed through patterning, while employing a fluorine containing etchant within a reactive ion etch (RIE) plasma etch method, the planarized first inter-metal dielectric (IMD) layer 24. The planarized first inter-metal dielectric (IMD) layer 24 is preferably patterned until there is reached the surfaces of the patterned first conductor layers 22a and 22b. The fluorine containing etchant within the reactive ion etch (RIE) plasma etch method is preferably chosen from the group of fluorine containing etchants consisting of C1–C3 per-fluorocarbons, C1–C3 hydro-fluorocarbons and nitrogen trifluoride. The reactive ion etch (RIE) plasma etch method employing the fluorine containing plasma etchant is preferably undertaken at fluorine containing etchant flow rate of from about 20 to about 80 standard cubic centimeters per minute (sccm), a radio frequency power of from about 500 to about 1400 watts, a reactor chamber pressure of from about 200 to about 600 mtorr, an argon flow rate of from about 200 to about 600 standard cubic centimeters per minute (sccm), a background helium flow rate or from about 7 to about 20 standard cubic centimeters per minute (sccm) and a substrate temperature of from about −10 to about 10 degrees centigrade.

Also shown in FIG. 3 is the presence of: (1) the patterned first fluorinated surface photoresist layers 26a'', 26b'' and 26c''; and (2) the patterned first non-fluorinated underlying photoresist layers 26a', 26b' and 26c' which are simultaneously formed from the patterned first photoresist layers 26a, 26b and 26c when the planarized first inter-metal dielectric layer 24 is patterned to form the patterned planarized first inter-metal dielectric (IMD) layers 24a, 24b and 24c. Under the fluorine containing plasma etchant reactive ion etch (RIE) etch conditions outlined for the preferred embodiment of the method of the present invention, the patterned first fluorinated surface photoresist layers 26a'', 26b'' and 26c'' will typically be from about 200 to about 3000 angstroms thick and the patterned first non-fluorinated underlying photoresist layers 26a', 26b' and 26c' will typically be from about 1800 to about 11000 angstroms thick.

Finally, there is shown in FIG. 3 the presence of first metal-polymer residues 27a, 27b, 27c and 27d formed upon the sidewalls of the vias etched to the surfaces of the patterned first conductor layers 22a and 22b when forming the patterned planarized first inter-metal dielectric (IMD) layers 24a, 24b and 24c. The first metal-polymer residues 27a, 27b, 27c and 27d are typically formed due to over-etching of the patterned first conductor layers 22a and 22b in order to assure adequate contact to the patterned first conductor layers 22a and 22b. Although with the preferred embodiment of the method of the present invention the metal-polymer residues 27a, 27b, 27c and 27d are aluminum containing metal-polymer residues, the method of the present invention may also be employed in removing other readily oxidizable metal-polymer residues from within integrated circuits. Such other readily oxidizable metal-polymer residues may include, but are not limited to copper containing metal-polymer residues. Metal-polymer residues such as the metal-polymer residues 27a, 27b, 27c and 27d are typically not easily removable through conventional high power and high temperature oxygen ashing since such conventional high power and high temperature oxygen ashing typically oxidizes the metal-polymer residue to form a metal oxide-polymer residue which strongly adheres to via sidewalls upon which it is formed.

Figure 4:
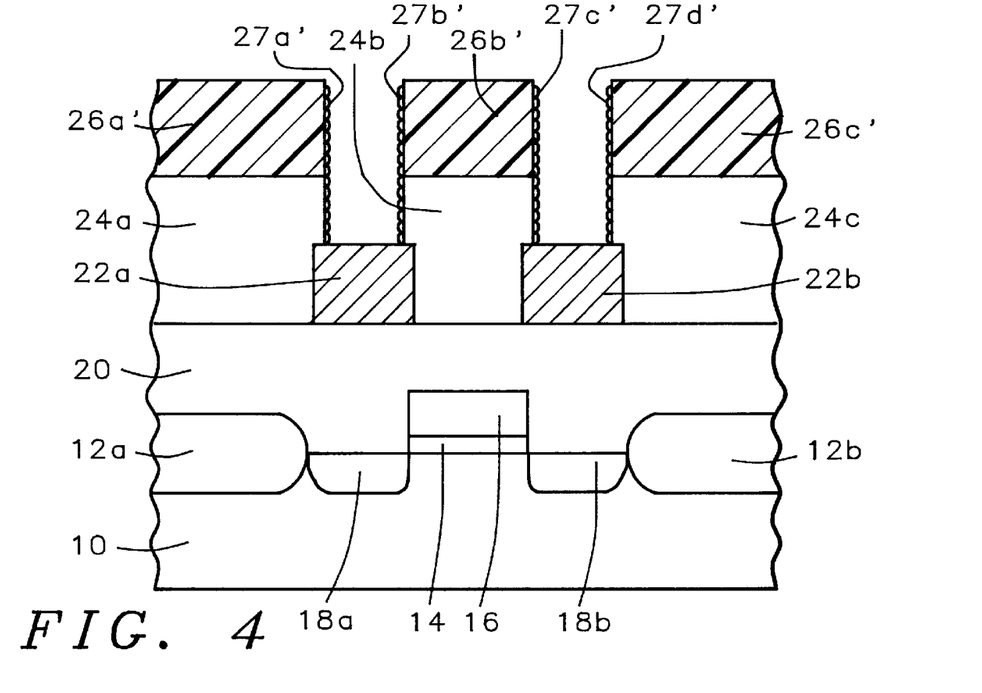

Referring now to FIG. 4, there is shown a schematic cross-sectional diagram illustrating the results of further processing of the integrated circuit whose schematic cross-sectional diagram is illustrated in FIG. 3. Shown in FIG. 4 is a schematic cross-sectional diagram of an integrated circuit otherwise equivalent to the integrated circuit whose schematic cross-sectional diagram is illustrated in FIG. 3, but from whose surface has been removed: (1) the patterned first fluorinated surface photoresist layers 26a", 26b" and 26c"; and (2) portions of the first metal-polymer residues 27a, 27b, 27c and 27d to form the partial first metal-polymer residues 27a', 27b', 27c' and 27d'. In order to remove the patterned first fluorinated surface photoresist layers 26a", 26b" and 26c" without: (1) damaging the patterned first inter-metal dielectric (IMD) layers 24a, 24b and 24c or the patterned first conductor layers 22a and 22b, or (2) oxidizing the partial first metal-polymer residues 27a', 27b', 27c' and 27d', it has been found experimentally that an argon containing plasma employing: (1) a comparatively high power and a comparatively low temperature; along with (2) a controlled reactor chamber pressure and a controlled argon flow rate, is preferably employed. Preferably the power of the argon containing plasma is from about 1000 to about 1500 watts at a radio frequency of 13.56 MHZ, while the temperature of the argon containing plasma is preferably no greater than about 20 degrees centigrade. Similarly, the argon containing plasma is preferably employed at a reactor chamber pressure of from about 200 to about 500 mtorr and an argon flow rate of from about 300 to about 600 standard cubic centimeters per minute (sccm). The argon containing plasma through which is removed the patterned first fluorinated surface photoresist layers 26a", 26b" and 26c" while simultaneously forming the partial first metal-polymer residues 27a', 27b', 27c' and 27d' is preferably, although not necessarily, a pure argon plasma. Preferably, the patterned first fluorinated surface photoresist layers 26a", 26b" and 26c" are exposed to the argon containing plasma at the comparatively high power and low temperature for a time period sufficient to at least partially remove the patterned first fluorinated surface photoresist layers 26a", 26b" and 26c" while not substantially oxidizing the partial first metal-polymer residues 27a', 27b', 27c' and 27d'. For the thickness range disclosed for the preferred embodiment of the method of the present invention, an exposure time of the patterned first fluorinated surface photoresist layers 26a", 26b" and 26c" to the argon containing plasma of from about 30 to about 80 seconds is typical and preferred.

Although not specifically illustrated by the schematic cross-sectional diagrams of FIG. 3 and FIG. 4, it is preferred within the preferred embodiment of the method of the present invention that: (1) the planarized first inter-metal dielectric (IMD) layer 24 is etched within the reactive ion etch (RIE) plasma etch method employing the fluorine containing etchant to form the patterned planarized first inter-metal dielectric (IMD) layers 24a, 24b and 24c; and (2) the patterned first fluorinated surface photoresist layers 26a", 26b" and 26c" are subsequently removed through the argon containing plasma from the integrated circuit whose schematic cross-sectional diagram is illustrated in FIG. 3 to form the integrated circuit whose schematic cross-sectional diagram is illustrated in FIG. 4 sequentially in-situ within the same reactor chamber.

Figure 5:
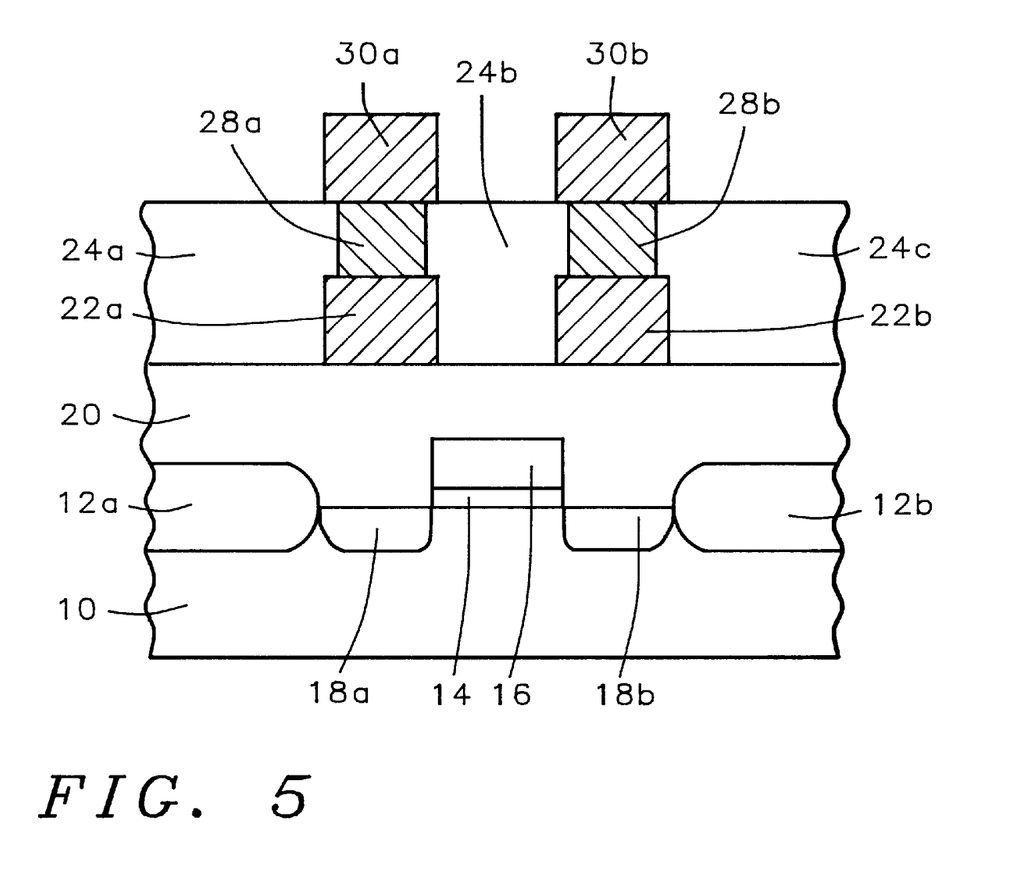

Referring now to FIG. 5, there is shown a schematic cross-sectional diagram illustrating the results of further processing of the integrated circuit whose schematic cross-sectional diagram is illustrated in FIG. 4. Shown in FIG. 5 is a schematic cross-sectional diagram of an integrated circuit analogous to the integrated circuit whose schematic cross-sectional diagram is illustrated in FIG. 4, but from whose surface has been removed: (1) the patterned first non-fluorinated underlying photoresist layers 26a', 26b' and 26c'; and (2) the partial first metal-polymer residues 27a', 27b', 27c' and 27d'. For the preferred embodiment of the method of the present invention, the patterned first non-fluorinated underlying photoresist layers 26a', 26b' and 26c' and the partial first metal-polymer residues 27a', 27b', 27c' and 27d' are preferably removed through a sequential wet chemical stripping method followed by a dry plasma stripping method as is known in the art. Within the sequential wet chemical stripping method followed by the dry plasma stripping method, at least the partial first metal-polymer residues 27a', 27b', 27c' and 27d' are removed through the wet chemical stripping method.

The wet chemical stripping method typically employs a solvent composition which readily dissolves the partial first metal-polymer residues 27a', 27b', 27c' and 27d' and may also substantially dissolve the patterned first non-fluorinated underlying photoresist layers 26a', 26b' and 26c'. Preferably, the wet chemical stripping method employs an amine based solvent stripper at a temperature of from about 85 to about 110 degrees centigrade for a time period of from about 5 to about 20 minutes.

The subsequent dry plasma stripping method typically removes any remaining portions of the patterned first non-fluorinated underlying photoresist layers 26a', 26b' and 26c' by employing an oxygen containing plasma at substantially higher temperature in comparison with the argon containing plasma employed in removing the patterned first fluorinated surface photoresist layers 26a", 26b" and 26c". Typically, the oxygen containing plasma employed in completely removing the patterned first non-fluorinated underlying photoresist layers 26a', 26b' and 26c' is provided at a power of from about 500 to about 1300 watts at a radio frequency of 13.56 MHz and a temperature of about 150 to about 350 degrees centigrade.

Also shown in FIG. 5 is the presence of; (1) a pair of first conductive interconnection studs 28a and 28b formed into the apertures between the patterned planarized first inter-metal dielectric (IMD) layers 24a, 24b and 24c; and (2) a pair of patterned second conductor layers 30a and 30b formed upon the surfaces of the patterned planarized first inter-metal dielectric (IMD) layers 24a, 24b and 24c and contacting the pair of patterned first conductive interconnection studs 28a and 28b. Methods and materials through which conductive interconnection studs may be formed within integrated circuits are known in the art of integrated circuit manufacture. Conductive interconnection studs may be formed within integrated circuits from conductive materials including but no limited to metals, metal alloys and highly doped polysilicon formed into apertures between patterned inter-metal dielectric (IMD) layers through methods including but not limited to thermal evaporation methods, chemical vapor deposition (CVD) methods and physical vapor deposition (PVD) sputtering methods. For the preferred embodiment of the method of the present invention, the pair of first conductive interconnection studs 28a and 28b is preferably formed at least in part of tungsten metal deposited through a chemical vapor deposition (CVD) method, as is common in the art. The pair of first conductive interconnection studs 28a and 28b is preferably formed to a thickness sufficient to reach the upper surfaces of the patterned planarized first inter-metal dielectric (IMD) layers 24a, 24b and 24c, while making contact with the patterned first conductor layers 22a and 22b. For the preferred embodiment of the method of the present invention, the patterned second conductor layers 30a and 30b are preferably formed through methods, materials and dimensions analogous to the methods, materials and dimensions employed in forming the patterned first conductor layers 22a and 22b.

As is understood by a person skilled in the art, the method of the present invention may be employed in removing fluorinated surface layers from partially fluorinated patterned photoresist layers employed in patterning silicon containing dielectric layers other than planarized first inter-metal dielectric (IMD) layers, such as the planarized first inter-metal dielectric (IDM) layer 24 as illustrated in FIG. 1 to FIG. 5. In that regard, there is shown in FIG. 6 to FIG. 9 a series of schematic cross-sectional diagrams illustrating the results of progressive stages in patterning a planarized second inter-metal dielectric (IMD) layer within the integrated circuit whose schematic cross-sectional diagrams is illustrated by FIG. 1 to FIG. 5.

Figure 6:
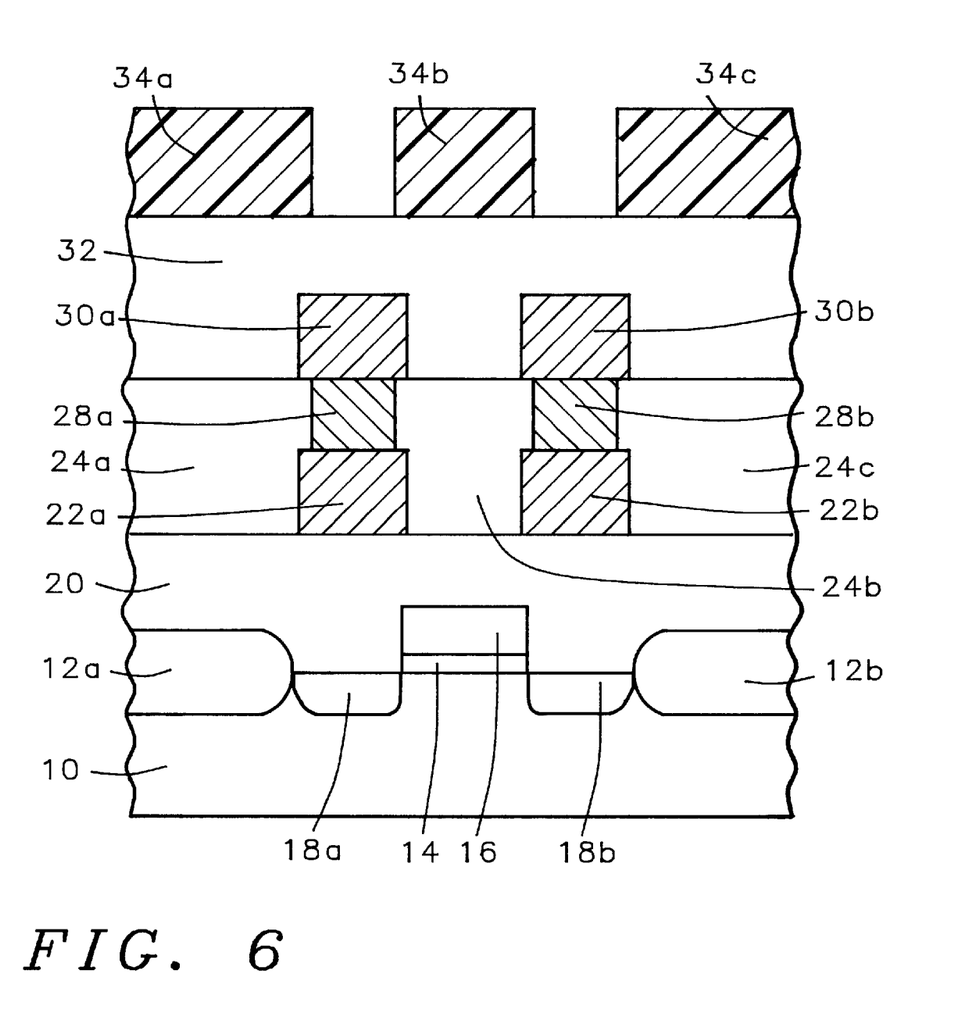

Analogously with FIG. 2, FIG. 6 shows a planarized second inter-metal dielectric (IMD) layer 32 formed upon the exposed portions of the patterned planarized first inter-metal dielectric (IMD) layers 24a, 24b and 24c, and the pair of patterned second conductor layers 30a and 30b. Also analogously with FIG. 2, FIG. 6 shows a series of patterned second photoresist layers 34a, 34b and 34c formed upon the surface of the planarized second inter-metal dielectric (IMD) layer 32. The planarized second inter-metal dielectric layer 32 is preferably formed through methods, materials and dimensions analogous to the methods, materials and dimensions employed in forming the planarized first inter-metal dielectric (IDM) layer 24. The patterned second photoresist layers 34a, 34b and 34c are preferably formed through methods, materials and dimensions analogous to the methods, materials and dimensions employed in forming the patterned first photoresist layers 26a, 26b and 26c.

Figure 7:
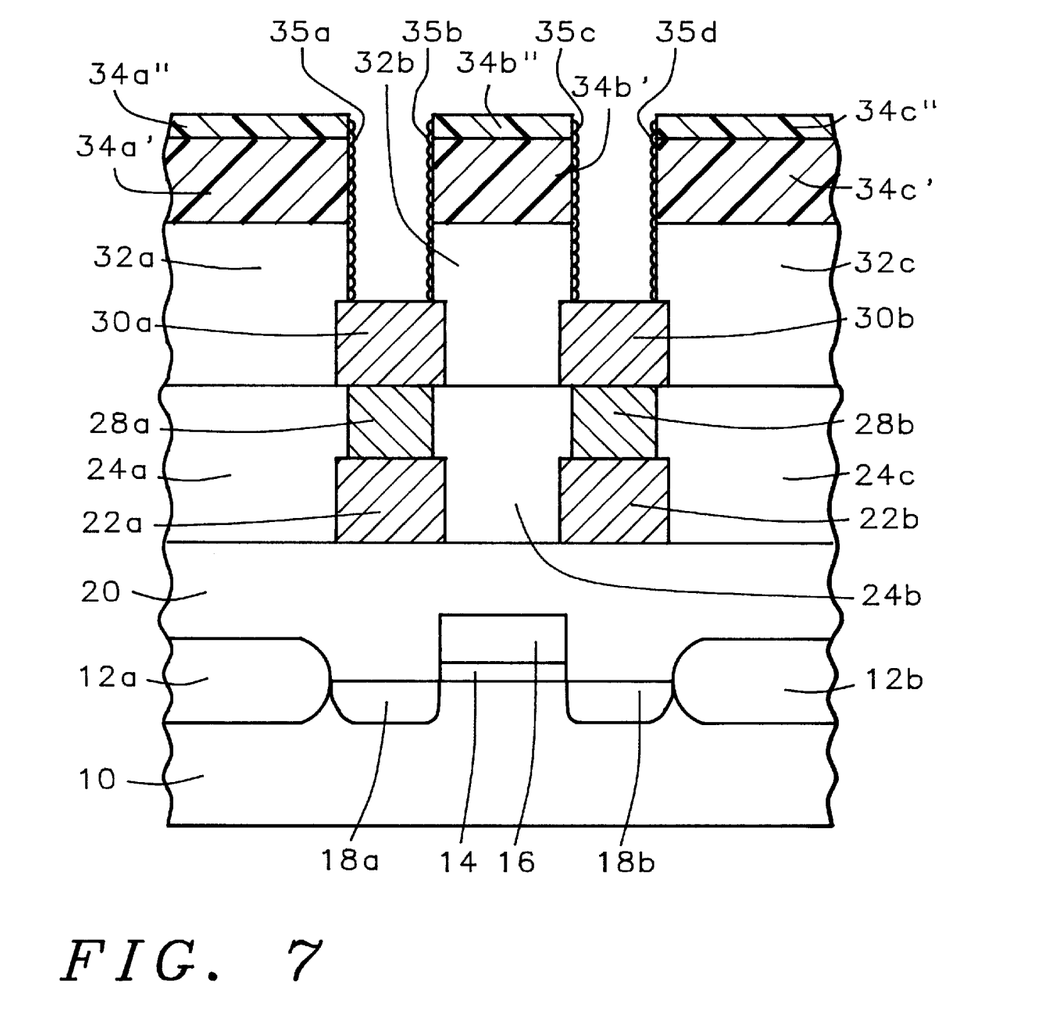

Referring now to FIG. 7, there is shown a schematic cross-sectional diagram illustrating the results of further processing of the integrated whose schematic cross-sectional diagram is illustrated in FIG. 6. Analogously with FIG. 3, FIG. 7 shows the results of patterning the planarized second inter-metal dielectric (IMD) layer 32 to form the patterned planarized second inter-metal dielectric (IMD) layers 32a, 32b and 32c through a fluorine containing plasma reactive ion etch (RIE) plasma etch method. The patterned planarized second inter-metal dielectric (IDM) layers 32a, 32b and 32c are patterned until there is reached the surfaces of the pair of patterned second conductor layers 30a and 30b. Simultaneously with forming the patterned planarized second inter-metal dielectric (IMD) layers 32a, 32b and 32c, there is formed from the patterned second photoresist layers 34a, 34b and 34c the patterned second fluorinated surface photoresist layers 34a", 34b" and 34c" and the patterned second non-fluorinated underlying photoresist layers 34a', 34b' and 34c'. There is also simultaneously formed the second metal-polymer residues 35a, 35b, 35c and 35d. The patterned planarized second inter-metal dielectric (IMD) layers 32a, 32b and 32c, the patterned second fluorinated surface photoresist layers 34a", 34b" and 34c", the patterned second non-fluorinated underlying photoresist layers 34a', 34b' and 34c' and the second metal-polymer residues 35a, 35b, 35c and 35d are formed through a fluorine containing reactive ion etch (RIE) method analogous to the fluorine containing reactive ion etch (RIB) method employed in forming the patterned planarized first inter-metal dielectric (IMD) layers 24a, 24b and 24c, the patterned first fluorinated surface photoresist layers 26a", 26b" and 26c", the patterned first non-fluorinated underlying photoresist layers 26a', 26b' and 26c' and the first metal-polymer residues 27a, 27b, 27c and 27d.

Figure 8:
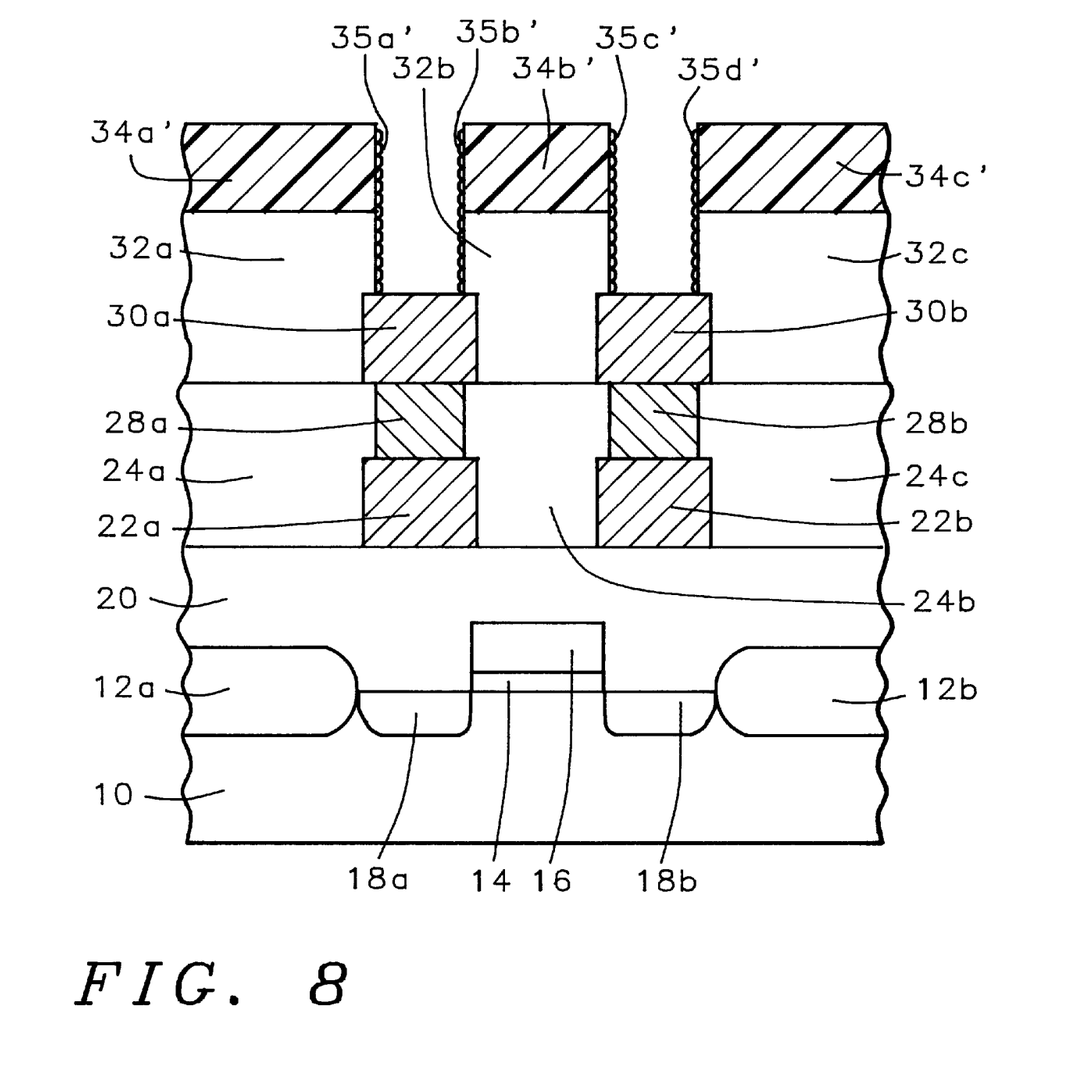

Referring now to FIG. 8, there is shown a schematic cross-sectional diagram illustrating the results of further processing of the integrated circuit whose schematic cross-sectional diagram is illustrated in FIG. 7. Shown in FIG. 8 is a schematic cross-sectional diagram of an integrated circuit otherwise equivalent to the integrated circuit whose schematic cross-sectional diagram illustrated in FIG. 7, but from whose surface has been removed the patterned second fluorinated surface photoresist layers 34a", 34b" and 34c", while simultaneously forming the partial second metal-polymer residues 35a', 35b', 35c' and 35d' from the second metal-polymer residues 35a, 35b, 35c and 35d. The patterned second fluorinated surface photoresist layers 34a", 34b" and 34c" are removed and the partial second metal-polymer residues 35a', 35b', 35c' and 35d' are formed employing a comparatively high power and low temperature argon containing plasma under equivalent conditions to the comparatively high power and low temperature argon containing plasma employed in removing the patterned first fluorinated surface photoresist layers 26a", 26b" and 26c" while simultaneously forming the partial first metal-polymer residues 27a', 27b', 27c' and 27d' within the integrated circuit whose schematic cross-sectional diagram is illustrated in FIG. 4.

Figure 9:
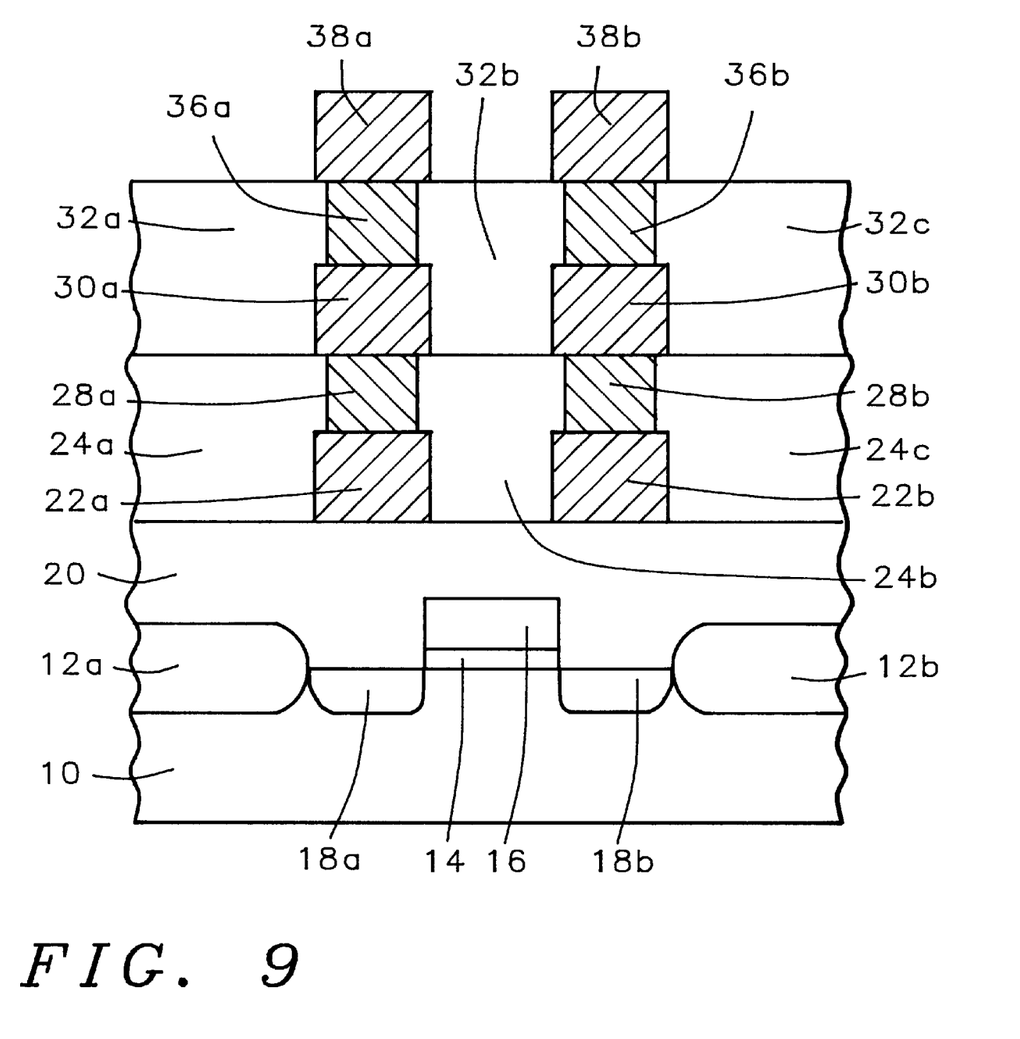

Referring now to FIG. 9, there is shown a schematic cross-sectional diagram illustrating the results of further processing of the integrated circuit whose schematic cross-sectional diagram is illustrated in FIG. 8. Shown in FIG. 9 is a schematic cross-sectional diagram of an integrated circuit analogous to the integrated circuit whose schematic cross-sectional diagram is illustrated in FIG. 8, but from whose surface has been removed: (1) the patterned second non-fluorinated underlying photoresist layers 34a', 34b' and 34c'; and (2) the partial second metal-polymer residues 35a', 35b', 35c' and 35d'. In addition, there is also shown within FIG. 9: (1) a pair of second conductive interconnection studs 36a and 36b formed within the apertures between the patterned planarized second inter-metal dielectric (IMD) layers 32a, 32b and 32c; and (2) a pair of patterned third conductor layers 38a and 38b formed upon the surfaces of the patterned planarized second inter-metal dielectric (IMD) layers 32a, 32b and 32c while simultaneously contacting the pair of second conductive interconnection studs 36a and 36b.

The patterned second non-fluorinated underlying photoresist layers 34a', 34b' and 34c' are removed through methods and materials equivalent to the methods and materials employed in removing the patterned first non-fluorinated underlying photoresist layers 26a', 26b' and 26c' from the corresponding patterned planarized first inter-metal dielectric (IMD) layers 24a, 24b and 24c. The pair of second conductive interconnection studs 36a and 36b is formed through methods, materials and dimensions equivalent to the methods, materials and dimensions employed in forming the pair of first conductive interconnection studs 28a and 28b. Finally, the pair of patterned third conductor layers 38a and 38b is formed through methods, materials and dimensions equivalent to the methods, materials and dimensions employed in forming the patterned second conductor layers 30a and 30b and the patterned first conductor layers 22a and 22b.

Upon forming the patterned third conductor layers 38a and 38b, there is formed through the preferred embodiment of the method of the present invention an integrated circuit having formed therein multiple patterned silicon containing insulator layers within which are formed conductive interconnection studs which interconnect patterned metal layers. The patterned silicon containing insulator layers are patterned employing a patterned photoresist layer and a fluorine containing reactive ion etch (RIE) plasma which simultaneously forms a fluorinated surface layer of the patterned photoresist layer. Through the method of the present invention, the fluornated surface layer of the patterned photoresist layer is removed through a stripping method employing an argon containing plasma at a comparatively high power and low temperature. By employing the argon containing plasma at the comparatively high power and low temperature the fluorinated surface layer of the patterned photoresist layer is removed without: (1) damaging other layers which adjoin the fluorinated surface layer, (2) forming a residue which impedes the formation of fully functional or reliable integrated circuits; or (3) oxidizing a metal-polymer residue which typically forms upon sidewalls of vias formed through silicon containing insulator layers to conductor metal contacts while employing the patterned photoresist layer as an etch mask.

As is understood by a person skilled in the art, the preferred embodiment of the method of the present invention is illustrative of the method of the present invention rather than limiting of the method of the present invention. Revisions may be made to methods, materials, structures and dimensions through which is practiced the preferred embodiment of the method of the present invention while still providing an embodiment which is within the spirit and scope of the present invention, as defined by the accompanying claims.

What is claimed is:

1. A method for removing from a patterned silicon containing dielectric layer within an integrated circuit a patterned partially fluorinated photoresist layer employed in patterning the patterned silicon containing dielectric layer comprising:

forming over a semiconductor substrate a metal contact layer;

forming upon the metal contact layer a silicon containing dielectric layer;

forming upon the silicon containing dielectric layer a patterned photoresist layer;

forming, while employing the patterned photoresist layer as an etch mask and by use of a reactive ion etch (RIE) plasma etch method employing a fluorine containing plasma etchant, a via through the silicon containing dielectric layer to form a patterned silicon containing dielectric layer, the via reaching the metal contact layer, the reactive ion etch (RIE) plasma etch method simultaneously forming from the patterned photoresist layer a partially fluorinated patterned photoresist layer comprising a patterned fluorinated surface layer of the partially fluorinated patterned photoresist layer and a patterned non-fluorinated underlying remainder layer of the partially fluorinated patterned photoresist layer, the reactive ion etch (RIE) plasma etch method also simultaneously forming upon the sidewalls of the via a metal-polymer residue layer;

removing, at least partially, the patterned fluorinated surface layer of the partially fluorinated patterned photoresist layer through a first stripping method, the first stripping method employing an argon containing plasma under conditions such that the metal-polymer residue layer is not substantially oxidized; and removing then through a second stripping method at least the metal-polymer residue layer from the sidewalls of the via.

2. The method of claim 1 wherein the patterned silicon containing dielectric layer is not damaged when removing from the patterned silicon containing dielectric layer the patterned partially fluorinated photoresist layer.

3. The method of claim 1 wherein:

the thickness of the patterned photoresist layer is from about 200 to about 14000 angstroms;

the thickness of the fluorinated surface layer of the patterned photoresist layer is from about 200 to about 300 angstroms; and the thickness of the non-fluorinated remainder layer of the patterned photoresist layer is from about 1800 to about 11000 angstroms.

4. The method of claim 1 wherein the patterned photoresist layer is formed from a photoresist material chosen from the group of photoresist materials consisting of novolak photoresist materials and poly methyl meth acrylate (PMMA) photoresist materials.

5. The method of claim 1 wherein:

the patterned photoresist layer is partially fluorinated through exposure to the fluorine containing plasma etchant at a radio frequency power of from about 500 to about 1400 watts; and the fluorine containing plasma etchant is chosen from the group of plasma etchants consisting of C1–C3 perfluorocarbons, C1–C3 hydro-fluorocarbons and nitrogen trifluoride.

6. The method of claim 1 wherein the argon containing plasma is an argon plasma.

7. The method of claim 1 wherein the argon containing plasma is employed at:

a radio frequency power of from about 1000 to about 1500 watts at a radio frequency of 13.56 MHZ; and a temperature of less than about 20 degrees centigrade.

8. The method of claim 1 wherein the second etch method is a wet chemical stripping method employing an amine based wet chemical stripping material.

9. The method of claim 1 wherein the reactive ion etch (RIE) plasma etch method and the first stripping method are undertaken sequentially in-situ within the same reactor chamber.

10. A method for removing from a patterned silicon containing dielectric layer within an integrated circuit a patterned partially fluorinated photoresist layer employed in patterning the patterned silicon containing dielectric layer comprising:

forming over a semiconductor substrate an aluminum metal contact layer;

forming upon the aluminum metal contact layer a silicon containing dielectric layer;

forming upon the silicon containing dielectric layer a patterned photoresist layer;

forming, while employing the patterned photoresist layer as an etch mask and by use of a reactive ion etch (RIE) plasma etch method employing a fluorine containing plasma etchant, a via through the silicon containing dielectric layer to form a patterned silicon containing dielectric layer, the via reaching the metal contact layer, the reactive ion etch (RIE) plasma etch method simultaneously forming from the patterned photoresist layer a partially fluorinated patterned photoresist layer comprising a patterned fluorinated surface layer of the partially fluorinated patterned photoresist layer and a patterned non-fluorinated underlying remainder layer of the partially fluorinated patterned photoresist layer, the reactive ion etch (RIE) plasma etch method also simultaneously forming upon the sidewalls of the via an aluminum metal-polymer residue layer;

removing, at least partially, the patterned fluorinated surface layer of the partially fluorinated patterned photoresist layer through a first stripping method, the first stripping method employing an argon containing plasma under conditions such that the aluminum metal-polymer residue layer is not substantially oxidized; and removing then through a second stripping method at least the aluminum metal-polymer residue layer from the sidewalls of the via.

11. The method of claim 10 wherein the patterned silicon containing dielectric layer is not damaged when removing from the patterned silicon containing dielectric layer the patterned partially fluorinated photoresist layer.

12. The method of claim 10 wherein:

the thickness of the patterned photoresist layer is from about 2000 to about 14000 angstroms;

the thickness of the fluorinated surface layer of the patterned photoresist layer is from about 200 to about 300 angstroms; and the thickness of the non-fluorinated remainder layer of the patterned photoresist layer is from about 1800 to about 11000 angstroms.

13. The method of claim 10 wherein the patterned photoresist layer is formed from a photoresist material chosen from the group of photoresist materials consisting of novolak photoresist materials and poly methyl meth acrylate (PMMA) photoresist materials.

14. The method of claim 10 wherein:

the patterned photoresist layer is partially fluorinated through exposure to the fluorine containing plasma etchant at a radio frequency power of from about 500 to about 1400 watts; and the fluorine containing plasma etchant is chosen from the group of plasma etchants consisting of C1–C3 perfluorocarbons, C1–C3 hydro-fluorocarbons and nitrogen trifluoride.

15. The method of claim 10 wherein the argon containing plasma is an argon plasma.

16. The method of claim 10 wherein the argon containing plasma is employed at:

a radio frequency power of from about 1000 to about 1500 watts at a radio frequency of 13.56 MHZ; and a temperature of less than about 20 degrees centigrade.

17. The method of claim 10 wherein the second etch method is a wet chemical stripping method employing an amine based wet chemical stripping material.

18. The method of claim 10 wherein the reactive ion etch (RIE) plasma etch method and the first stripping method are undertaken sequentially in-situ within the same reactor chamber.

* * * * *